United States Patent [19]
Ishiyama et al.

[11] Patent Number: 5,539,372
[45] Date of Patent: Jul. 23, 1996

[54] MAGNETIC RESISTANCE ELEMENT, METHOD FOR PREPARING THE SAME AND MAGNETIC SENSOR USING THE SAME

[75] Inventors: Noritaka Ishiyama; Kotaro Kobayashi, both of Kawasaki, Japan

[73] Assignee: Mitsubishi Steel Mfg. Co., Ltd., Tokyo, Japan

[21] Appl. No.: 78,203

[22] PCT Filed: Aug. 29, 1991

[86] PCT No.: PCT/JP91/01153

§ 371 Date: Jun. 17, 1993

§ 102(e) Date: Jun. 17, 1993

[87] PCT Pub. No.: WO92/11661

PCT Pub. Date: Jul. 9, 1992

[30] Foreign Application Priority Data

Dec. 20, 1990 [JP] Japan ................................ 2-403831
Dec. 28, 1990 [JP] Japan ................................ 2-415436
Dec. 28, 1990 [JP] Japan ................................ 2-415437

[51] Int. Cl.⁶ ................................................ H01L 43/00
[52] U.S. Cl. ........................... 338/32 R; 324/207.21; 324/252; 428/694 TP
[58] Field of Search ......................... 338/32 R, 32 H; 428/413, 694 TP, 408; 427/127, 128, 130, 131, 132; 324/207.21, 252

[56] References Cited

U.S. PATENT DOCUMENTS

| | | | |
|---|---|---|---|
| 4,309,482 | 1/1982 | Suzuki et al. | 428/413 |
| 5,061,562 | 10/1991 | Yamanaka et al. | 428/408 |
| 5,073,460 | 12/1991 | Futamoto et al. | 428/692 |
| 5,132,173 | 7/1992 | Hashimoto et al. | 428/336 |

FOREIGN PATENT DOCUMENTS

| | | |
|---|---|---|
| 0060632 | 9/1982 | European Pat. Off. |
| 57-95687 | 6/1982 | Japan . |
| 61-39592 | 2/1986 | Japan . |
| 1-184885 | 7/1989 | Japan . |

OTHER PUBLICATIONS

Patent Abstracts of Japan, vol. 12, No. 246 (1988) of JP-A-63 033 880.

*Primary Examiner*—Marvin M. Lateef
*Attorney, Agent, or Firm*—Frishauf, Holtz, Goodman, Langer & Chick

[57] ABSTRACT

A magnetic resistance element which contains a substrate, a ferromagnetic thin film containing a member of Fe—Ni alloys series formed on said substrate, a first protective film containing silicon oxide formed on said ferromagnetic thin film and a second protective film containing a synthetic resin formed on said first protective film.

8 Claims, 6 Drawing Sheets

PRIOR ART

MAGNETIC RESISTANCE ELEMENT, METHOD FOR PREPARING THE SAME AND MAGNETIC SENSOR USING THE SAME

TECHNICAL FIELD

This invention relates to a magnetic resistance element, a method for preparing the same and a magnetic sensor using the same, more specifically to a magnetic resistance element for a magnetic encoder covered with a protective film, a method for preparing the same and a magnetic sensor using the same.

BACKGROUND ART

Figure 2:
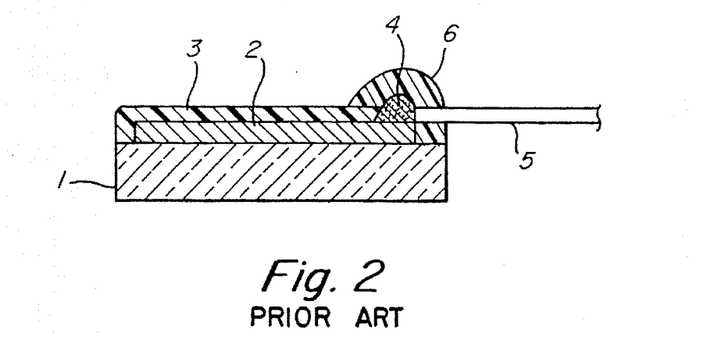
FIG. 2 is a sectional view of a conventional magnetic resistance element.

In the prior art, a magnetic resistance element has a structure shown in FIG. 2. That is, a ferromagnetic thin film 2 comprising a Ni—Fe alloy, a Ni—Co alloy, etc. is formed on a substrate such as glass, ceramics of alumina, etc., and a protective film 3 is formed on the ferromagnetic thin film 2. As the protective film 3, there has been generally used a silicon oxide layer with a film thickness of 10 to 30 µm formed from silicon oxide by a CVD method, sputtering, etc. or a thin layer with a film thickness of 5 to 10 µm comprising a non-water permeable resin such as a polyimide resin, an epoxy resin or a polyamide resin, etc. A lead wire 5 is connected with the end portion of the ferromagnetic thin film 2 by means of solder 4. A mounting portion by the solder 4 is covered with a resin 6.

However, in the protective film 3 comprising silicon oxide, fine cracks and pinholes exist so that water is penetrated through these cracks and pinholes, whereby there involves a problems that the ferromagnetic thin film 2 comprising a Ni—Co alloy, etc. is corroded. For this reason, in the prior art, the film thickness of the protective film 3 has been made as thick as 10 to 30 µm to decrease fine cracks and pinholes, whereby moisture resistance is improved. However, it is impossible to prevent cracks and pinholes completely, and there still involves a problem that the ferromagnetic thin film 2 is corroded by water.

Further, when the film thickness of the protective film 3 is made thick, there involve problems that a distance between the ferromagnetic thin film 2 and a magnetic material to be detected is broadened so that detection output is lowered, and cracks are easily formed on the substrate and the protective film 3 by thermal shock since thermal expansion rate of the ferromagnetic thin film 2 comprising a metal is greatly different from those of the substrate 1 comprising ceramics and the protective film 3.

Also, when the protective film 3 comprising a non-water permeable resin such as a polyimide resin, an epoxy resin or a polyamide resin, etc. is formed on the ferromagnetic thin film 2, there involve a problem that a resin is coated in the air so that molecules of water adsorbed on the ferromagnetic thin film 2 are encapsulated by the resin, and the ferromagnetic thin film 2 is corroded by the molecules of water or a minute amount of water contained in the resin.

An object of the present invention is to solve the above problems, and to provide a magnetic resistance element in which moisture resistance is excellent, detected output is enlarged by making the film thickness of a protective film thinner and no crack is formed by thermal shock, and a method for preparing the same.

DISCLOSURE OF THE INVENTION

The magnetic resistance element of the present invention comprises a substrate, a ferromagnetic thin film formed on said substrate, a first protective film comprising silicon oxide ($SiO_x$ wherein $0.5 \leq x \leq 2$) formed on said ferromagnetic thin film and a second protective film comprising a synthetic resin formed on said first protective film.

The method for preparing the magnetic resistance element of the present invention comprises a first step of heating a substrate on which a ferromagnetic thin film is formed under vacuum at 150° to 350° C., a second step of forming a first protective film of silicon oxide ($SiO_x$ wherein $0.5 \leq x \leq 2$) on said ferromagnetic thin film on said substrate, and a third step of forming a second protective film comprising a synthetic resin on said first protective film.

Further, the magnetic sensor of the present invention is a magnetic resistance effective type element sensor which comprises a synthetic resin thin film fitted between a head of a magnetic resistance effective type element sensor comprising a substrate, a ferromagnetic thin film formed on said substrate and a synthetic resin thin film formed on said ferromagnetic thin film; and a magnetic resistance effective type mounting into which a cylindrical magnetic recording medium magnetized in a direction perpendicular to an axis is inserted.

The method for preparing the magnetic sensor of the present invention is a method for preparing a magnetic resistance effective type magnetic sensor in which a detecting portion in which a thin film layer having magnetic resistance effect is formed on a substrate, zigzag insulating lines are carved on said thin film layer to provide current passages for forming elements, and further said thin film layer is covered with a protective layer made of a synthetic resin, and a lead portion having current passages to be connected with the current passages of said detecting portion are fixed in a pair of jigs one of which moves in close to the other precisely, respectively, and the detecting portion and the lead portion are connected under a state that their terminal portions are coincident, characterized in that among the above pair of jigs, the jig in which the lead portion is fixed is equipped with a pin, and a hole for positioning into which the pin of the jig is inserted is formed on the lead portion to move the lead portion and said jig integrally.

Figure 1:
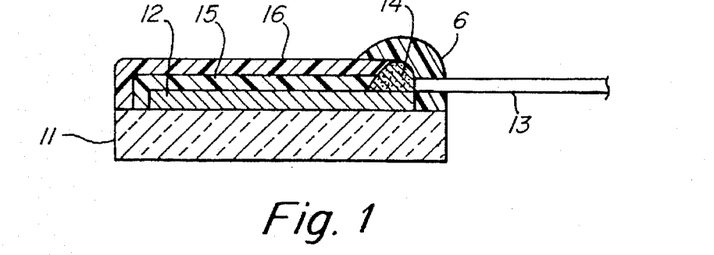
FIG. 1 is a sectional view of the magnetic resistance element of the present invention.

The magnetic resistance element of the present invention is described by referring to FIG. 1. On a substrate 11 comprising glass, ceramics such as alumina, etc., a ferromagnetic thin film 12 comprising a Ni—Fe alloy, a Co—Fe alloy, etc. is formed. A lead wire 13 is connected with the end portion of the ferromagnetic thin film 12 by means of solder 14. The mounting portion by the solder 14 is covered with a resin. On the ferromagnetic thin film 12, a first protective film 15 comprising silicon oxide ($SiO_x$ wherein $0.5 \leq x \leq 2$) is formed to protect the ferromagnetic thin film 12. If x is smaller than 0.5, conductivity is imparted to the film, while if it exceeds 2, oxygen becomes excessive undesirably. Particularly preferred is $0.8 \leq x \leq 1.5$.

The film thickness of the first protective film 15 is preferably 0.1 to 10 µm. If the film thickness is thinner than 0.1 µm, the film becomes too thin so that molecules of water are permeated unrestrictedly, while if it is thicker than 10 µm, a distance between the ferromagnetic thin film 12 and a magnetic material is broadened. More preferred is 0.5 to 2 µm.

On the first protective film 15, a second protective film 6 comprising a synthetic resin such as a polyimide resin, an epoxy resin, a polyether amide resin or Nylon, etc. to cover fine cracks and pinholes formed on the first protective film 15. The film thickness of the second protective film 16 is preferably 1 to 10 µm. If the thin film is thinner than 1 µm, water resistance is worsened, while if it is thicker than 10 μm, a distance between the ferromagnetic thin film 12 and a magnetic material is broadened. More preferred is 1.5 to 5 μm.

The magnetic resistance element of the present invention is prepared as described below. As a first step, first of all, a substrate on which the ferromagnetic thin film 12 is formed is heated under vacuum at 150° to 350° C. for 30 to 120 minutes to desorb molecules of water adsorbed on the surface of the ferromagnetic thin film 12. Next, as a second step, the first protective film 15 with a film thickness of 0.1 to 10 μm comprising silicon oxide ($SiO_x$ wherein $0.5 \leq x \leq 2$) is formed on the ferromagnetic thin film 12 on the substrate 11 by a CVD method or sputtering.

In order to prepare the first protective film 15 comprising silicon oxide ($SiO_x$ wherein $0.5 \leq x \leq 2$) by a CVD method, the substrate 11 obtained in the first step is placed in a reaction furnace, and a gas mixture of silane ($SiH_4$) and oxygen ($O_2$) as a starting gas and a carrier gas such as argon (Ar), etc. are flown into the furnace to carry out reaction.

In order to prepare the first protective film 15 comprising silicon oxide ($SiO_x$ wherein $0.5 \leq x \leq 2$) by sputtering, after the substrate 11 obtained in the first step and silicon oxide ($SiO_y$ wherein $0.9 < y < 1.1$) as a vapor deposition starting material are placed at determined positions in a vessel, air is exhausted up to a pressure of $1 \times 10^{-3}$ to $1 \times 10^{-7}$ Torr, and then sputtering is carried out. The sputtering voltage is 500 to 3000 V, the sputtering current 50 to 300 mA, and the time is 0.1 to 2 hours.

Next, as a third step, on the first protective film 15 obtained in the second step, the second protective film 16 with a film thickness of 1 to 10 μm comprising a non-permeable resin such as a polyimide resin, an epoxy resin, a polyether amide resin or a polyamide resin such as Nylon, etc. is formed by uniform coating or adhesion of a thin film.

In the first step, by heating the substrate 11 on which the ferromagnetic thin film 12 is formed to desorb molecules of water adsorbed on the ferromagnetic thin film 12, conventional corrosion of the ferromagnetic thin film 12 caused by water adsorbed on the ferromagnetic thin film 12 can be prevented.

Further, by forming the second protective film 16 comprising a non-permeable resin such as polyimide, an epoxy resin, a polyether amide resin or a polyamide resin, etc. on the first protective film 15 to cover fine cracks and pinholes on the first protective film 15, molecules of water in the air are not penetrated through cracks and pinholes, whereby the ferromagnetic thin film 12 is not corroded. Further, the ferromagnetic thin film 12 is not corroded by a minute amount of water contained in the resin.

Further, even when the film thickness of the first protective film 15 and the film thickness of the second protective film 16 are made thinner than the film thickness of a protective film of a conventional magnetic resistance element, moisture resistance which is more excellent than that of a conventional one can be obtained. Thus, a distance between the ferromagnetic thin film 12 and a magnetic material to be detected is shortened, whereby large detection output can be obtained.

Further, by making the first protective film 15 comprising $SiO_x$ thinner and forming the second protective film 16 comprising a resin thereon, thermal stress caused by thermal shock can be alleviated and formation of cracks on the substrate 11 and the first protective film 15 can be prevented.

DESCRIPTION OF NUMERALS 1, 11 ... substrate, 2, 12 ... ferromagnetic thin film layer, 3 ... protective film, 4, 14 ... solder, 5, 13 ... lead wire, 6 ... resin, 15 ... first protective film, 16 ... second protective film, 21 ... magnetic resistance effective type element sensor, 22 ... frequence-printed circuit, 23 ... polyimide resin film, 24 ... cylindrical magnetic recording medium, 25 ... magnetic resistance effective type mounting, 26 ... substrate, 27 ... Permalloy, 28 ... polyether amide resin, 29 ... polyimide resin, 30 ... conductive material, 102 ... detecting head (magnetic resistance effective type magnetic sensor), 103 ... log-shaped magnetic medium, 104 ... detecting portion, 105 ... lead portion, 107 ... magnetized portion, 110 ... substrate, 111 ... thin film layer, 112 ... protective layer, 113 ... insulating line, 114 ... current passage at detecting portion side, 115 ... element, 116 ... terminal portion of current passage at detecting portion side, 125 ... current passage at lead portion side, 140 ... terminal portion of current passage at lead portion side, 143, 149 ... removed portion, 144, 145 ... jig, 141 ... solder, 146 ... hole for positioning, 147 ... pin, 148 ... soldering iron

BEST MODE FOR PRACTICING THE INVENTION

EXAMPLE A

EXAMPLE A-1

A substrate comprising glass on which a ferromagnetic thin film with a film thickness of 0.1 µm comprising a Ni—Fe alloy comprising 87% by weight of Ni and 13% by weight of Fe was placed in a reaction vessel, and heating treatment was carried out by heating under a pressure of $1\times10^{-5}$ Torr at 300° C. for 60 minutes.

Next, a gas mixture of $SiH_4$ and $O_2$ and Ar as a carrier gas are flown into the reaction vessel, and reaction was carried out at 250° C. under a pressure of $1\times10^{-3}$ arm for one hour to form a first protective film with a film thickness of 1 µm comprising SiO on the ferromagnetic thin film by a CVD method.

Next, the substrate on which the first protective film was formed was taken out from the reaction vessel, and a polyether amide resin (produced by Hitachi Chemical Co., Ltd., trade name: HIMAL HL-1210) was coated thereon to have a coating thickness of 2 µm and cured at 180° C. for 1 hour.

Three magnetic resistance elements obtained by the method described above were prepared, and moisture resistance was tested at 80° C. and a relative humidity of 80% to find that none of the ferromagnetic thin film layers was corroded. When the magnetic resistance element obtained was used as a magnetic encoder, the detection output was 56 mV.

Further, three magnetic resistance elements obtained were prepared and taken out from a thermostat chamber at 150° C. and exposed to room temperature, and then thermal shock was given thereto to find that cracks were formed in none of the elements.

Further, after three magnetic resistance elements obtained were left to stand for 2000 hours, presence or absence of corrosion of the ferromagnetic thin film layers caused by water which had been adsorbed on the substrate or water contained in the resin was examined to find that none of the ferromagnetic thin film layers was corroded.

EXAMPLE A-2

A magnetic resistance element was prepared in the same manner as in Example 1 except for forming a first protective film with a thickness of 0.5 µm comprising SiO by carrying out sputtering with silicon oxide (SiO) as a target under a pressure of $1\times10^{-3}$ Torr at a voltage of 2500 V and a current of 150 mA for a time of 1 hour in place of a CVD method.

The magnetic resistance elements obtained were tested in the same manner as in Example 1 to find that none of the three ferromagnetic thin film layers was corroded in moisture resistance test. Cracks were formed by thermal shock in none of the three elements. The detection output was 63 mV.

Further, in the same manner as in Example 1, presence or absence of corrosion of the ferromagnetic thin film layers caused by water which had been adsorbed on the substrate or water contained in the resin was examined to find that none of the three ferromagnetic thin film layers was corroded.

Comparative Example A-1

On a ferromagnetic thin film layer on the substrate used in Example 1, a protective film with a film thickness of 1 µm comprising SiO was formed according to a CVD method by flowing a gas mixture of $SiO_4$ and $O_2$ and Ar as a carrier gas into a reaction vessel and carrying out reaction at a temperature of 250° C. under a pressure of $1\times10^{-3}$ atm for 1 hour.

For the magnetic resistance elements obtained, moisture resistance test was conducted in the same manner as in Example 1 to find that all ferromagnetic thin film layers were corroded. Cracks were formed by thermal shock in two of the three elements. The detection output was 53 mV.

Comparative Example A-2

On the substrate used in Example 1 not subjected to heating treatment, a polyether amide resin (produced by Hitachi Chemical Co., Ltd., trade name: HIMAL HL-1210) was coated and cured to form a protective film with a thickness of 2 µm.

For the magnetic resistance elements obtained, moisture resistance test was conducted in the same manner as in Example 1 to find that one of the ferromagnetic thin film layers was corroded. When the magnetic resistance element obtained was used as a magnetic encoder, the detection output was 59 mV.

Comparative Example A-3

On the substrate used in Example 1, a protective film with a thickness of 15 µm comprising SiO was formed by carrying out sputtering with silicon oxide (SiO) as a target under a pressure of $1\times10^{-3}$ Torr at a voltage of 2500 V for a time of 2 hours.

The magnetic resistance elements obtained were tested in the same manner as in Example 1 to find that two of the three ferromagnetic thin film layers were corroded in moisture resistance test. Cracks were formed by thermal shock in all elements. The detection output was 20 mV.

Comparative Example A-4

On the substrate of Example 1 not subjected to heating treatment, a polyether amide resin (produced by Hitachi Chemical Co., Ltd., HIMAL HL-1210) was coated and cured to form a protective film with a thickness of 5 µm.

Further, in the same manner as in Example 1, presence or absence of corrosion of the ferromagnetic thin film layers caused by water which had been adsorbed on the substrate or water contained in the resin was examined to find that all of the three ferromagnetic thin film layers were corroded.

As clearly understood from the above description, in the magnetic resistance element of the present invention, moisture resistance is excellent and a film thickness of a protective film can be made thin so that a distance between a ferromagnetic thin film layer and a magnetic material is shortened to enlarge detection output. Further, a first protective film comprising silicon oxide is made thin and a second protective film comprising a resin is formed thereon so that thermal stress caused by thermal shock can be alleviated. Thus, cracks are hardly formed on a substrate and a first protective film.

EXAMPLE B

The present Example is concerned with a magnetic resistance effective type element sensor of a printing device used with a cylindrical magnetic recording medium magnetized in a direction perpendicular to an axis.

A head of the magnetic resistance effective type element sensor shown in Example A is formed of a substrate, a ferromagnetic thin film formed on said substrate and a synthetic resin thin film formed on said ferromagnetic thin film. Thus, the synthetic resin thin film of the head of the magnetic resistance effective type element sensor is abraded by contact with a cylindrical magnetic recording medium, and further, the ferromagnetic thin film layer may be damaged to lower sensibility of the magnetic resistance effective type element sensor.

An object of the present Example is to provide a sensor equipped with a protection device to prevent damages of the synthetic resin thin film layer and the ferromagnetic thin film layer even when the head of the magnetic resistance effective type element sensor is slid.

In order to accomplish the above object, in the sensor of the present Example, a synthetic resin thin film is fitted between a head of a magnetic resistance effective type element sensor comprising a substrate, a ferromagnetic thin film formed on said substrate and a synthetic resin thin film formed on said ferromagnetic thin film; and a magnetic resistance effective type mounting into which a cylindrical magnetic recording medium magnetized in a direction perpendicular to an axis is inserted.

Figure 3:
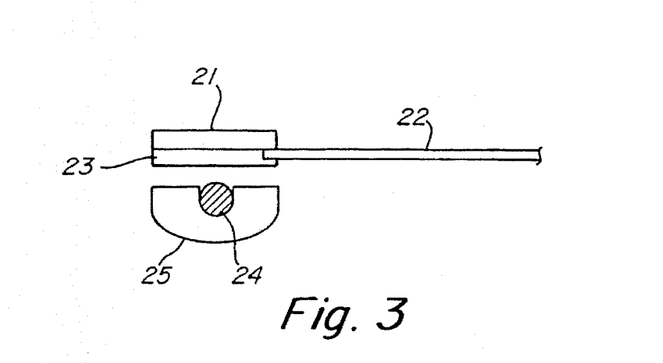
FIG. 3 is a side sectional view of a magnetic resistance effective type element sensor of Example B of the present invention.

FIG. 3 is a view showing the present Example, 21 is a magnetic resistance effective type element sensor, and one end of this magnetic resistance effective type element sensor is connected with a frequence-printed circuit 22 which is a port outputting digital electric signals. 23 is a synthetic resin thin film of the present Example, particularly preferably a polyimide resin thin film or a polyamide resin thin film, but the film is not limited thereto. As a material of this protective film, a polyimide resin thin film was used in the present Example, but it is not particularly limited so long as it is a heat-resistant synthetic resin other than a polyimide resin thin film.

The frequence-printed circuit 22 and the polyimide resin thin film 23 are preferably bonded with an epoxy resin type adhesive, which is not limitative.

24 is a cylindrical magnetic recording medium, and in this cylindrical magnetic recording medium 24, north poles of a magnetic field and south poles of a magnetic field are recorded as N-S, S-N, N-S, S-N and N-S in a direction perpendicular to an axis. A distance between pitches of north poles and south poles recorded in a longer direction is at least 20 μm more.

25 is a magnetic resistance effective type mounting. The above cylindrical magnetic recording medium 24 is inserted thereinto, and the mounting is designed to control a gap so that a predetermined distance between the head portion of the magnetic resistance effective type element sensor 21 and the surface of the cylindrical magnetic recording medium 24 can be always kept.

The magnetic resistance effective type mounting 25 comprises brass or a synthetic resin, etc., but any material may be used so long as it is a non-magnetic material.

Figure 4:
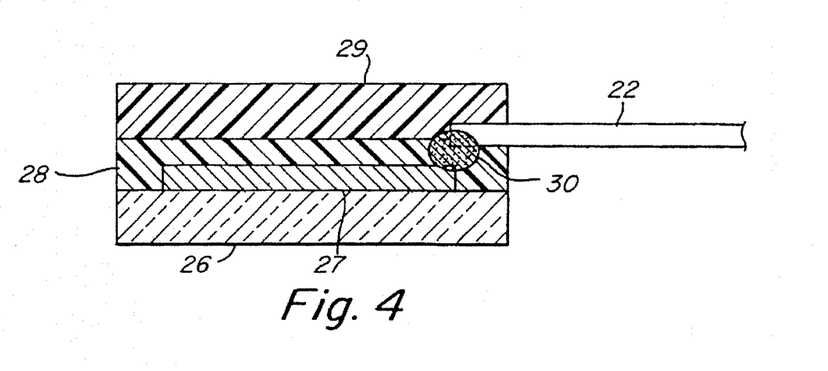
FIG. 4 is a sectional view of a head portion of the magnetic resistance effective type element sensor of Example B of the present invention.

FIG. 4 is a sectional view of the head of the magnetic resistance effective type element sensor of the present Example, and a substrate 26, a ferromagnetic thin film 27, a protective film 28 and further a synthetic resin thin film 29 are laminated in this order. In the present Example, as a material of the substrate 26, glass was used, but ceramics may be also used. As a material of the ferromagnetic thin film 27, Permalloy which is a magnetic resistance effective material of a ferromagnetic material was used. As a material of the protective film 28, a polyether amide resin having good electrical insulating property was used. The protective film 28 protects a Permalloy layer and insulates the Permalloy layer electrically. Further, as a material of the synthetic resin thin film 29, a polyimide resin having good electrical insulating property was used, but a polyamide resin may be also used. The Permalloy 27 and the frequence-printed circuit 22 are electrically connected with a conductive material 30 such as solder, etc.

As to sizes of the respective materials laminated on the head of the magnetic resistance effective type element sensor of the present Example, the substrate 26 was 1000 μm, the Permalloy 27 was 0.1 μm, the polyether amide resin 28 was 5 μm and the polyimide resin 29 was 30 μm.

When the head of the magnetic resistance effective type element sensor 21 is slid over the cylindrical magnetic recording medium 24, the head of the magnetic resistance effective type element sensor 21 on which the polyether amide resin 28 with a thickness of 5 μm and also the polyimide resin 29 with a thickness of 30 μm are laminated is slid over the cylindrical magnetic recording medium 24. Therefore, the polyimide resin 29 of the head of the magnetic resistance effective type element sensor 21 is designed to prevent abrasion by contact with the cylindrical magnetic recording medium 24, damage of the Permalloy layer and lowering of sensibility of the magnetic resistance effective type element sensor, further, protect the head of the magnetic resistance effective type element sensor 21, prevent loss of magnetic characteristics of the Permalloy 27 of the head of the magnetic resistance effective type element 21, and also control a gap so that a predetermined distance between the Permalloy layer of the head portion of the magnetic resistance effective type element sensor 21 and the surface of the cylindrical magnetic recording medium 24 can be always kept similarly as the function of the magnetic resistance effective type mounting.

EXAMPLE C

The present Example is concerned with a method for preparing a magnetic resistance effective type magnetic sensor, particularly to a method for preparing a magnetic resistance effective type magnetic sensor suitably used for a magnetic type encoder.

As a conventional magnetic resistance effective type magnetic sensor, there have been known, for example, those disclosed in Japanese Patent Publication No. 41335/1979, Japanese Patent Publication No. 5067/1982, etc.

As well known in the art, effectiveness of magnetic resistance is decreased in proportion to elevation of temperature. Thus, by a conventional magnetic resistance effective type magnetic sensor, useful output cannot be obtained at a temperature range, for example, exceeding 70° C., and reliability cannot be maintained.

Thus, the present inventors has separately developed a magnetic resistance effective type magnetic sensor in which decrease of effectiveness of magnetic resistance caused by temperature elevation can be compensated and useful output can be obtained even under high temperature atmosphere.

This developed magnetic resistance effective type magnetic sensor comprises a detecting portion and a lead portion having a plural number of current passages, respectively, connected under a state that terminal portions of the current passages of the both portions are coincident. Therefore, it is necessary to connect the detecting portion and the lead portion under a state that they are positioned precisely.

This invention has been made by paying attention to such a prior art, and is to provide a method for preparing a magnetic resistance effective type magnetic sensor in which a lead portion can be connected with a detecting portion under a state that they are positioned precisely.

In order to accomplish the above object, the method for preparing the magnetic resistance effective type magnetic sensor according to the present invention is a method for preparing a magnetic resistance effective type magnetic sensor in which a detecting portion in which a thin film layer having magnetic resistance effect is formed on a substrate, zigzag insulating lines are carved on said thin film layer to provide current passages for forming elements, and further said thin film layer is covered with a protective layer made of a synthetic resin, and a lead portion having current passages to be connected with the current passages of said detecting portion are fixed in a pair of jigs one of which moves in close to the other precisely, respectively, and the detecting portion and the lead portion are connected under a state that their terminal portions are coincident, characterized in that among the above pair of jigs, the jig in which the lead portion is fixed is equipped with a pin, and a hole for positioning into which the pin of the jig is inserted is formed on the lead portion to move the lead portion and said jig integrally.

In the following, the present Example is described. For convenience' sake, before description of the preparation process, the magnetic resistance effective type magnetic sensor itself is described previously by using FIG. 12 to FIG. 18.

Figure 15:
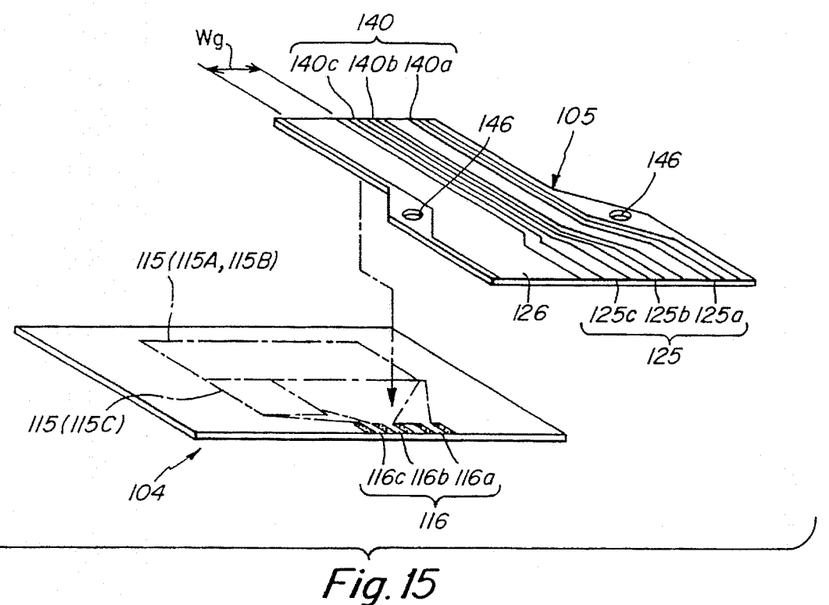
FIG. 15 is a perspective view showing a relation between a detecting portion and a lead portion of a detecting head.
Figure 16:
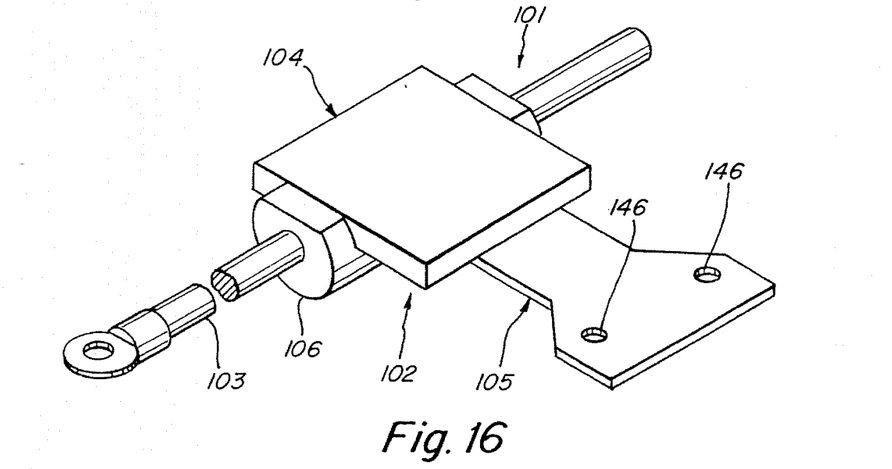
FIG. 16 is a perspective view of a linear encoder using the magnetic resistance effective type magnetic sensor according to the present invention.
Figure 17:
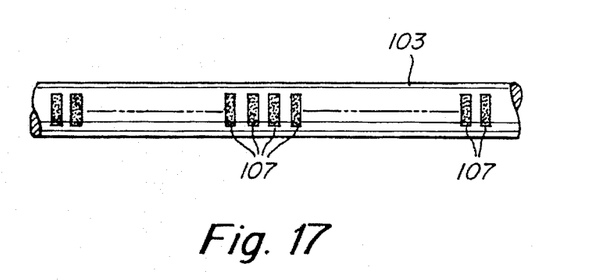
FIG. 17 is a plane view of a magnetic medium.
Figure 18:
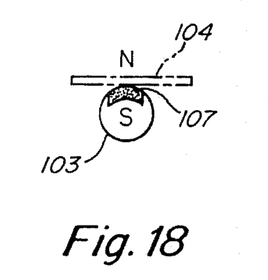
FIG. 18 is a side view of a magnetic medium.

The present Example is an example of using said sensor in a linear encoder 101 having a structure shown in FIG. 16. The linear encoder 101 is formed of a detecting head 102 which is a magnetic resistance effective magnetic sensor and a log-shaped magnetic medium 103. Further, the detecting head 102 is equipped with a lead portion 105 to connect a detecting portion 104 shown in FIG. 15 with a controlling portion not shown in the figure. The detecting portion 104 is connected with a guide tube 106 to move the detecting portion 104 along with the magnetic medium 103. While moving along with the above magnetic medium 103 (FIG. 17) in which a large number of magnetized portions 107 are magnetized at predetermined intervals, the detecting portion 104 outputs predetermined signals by detecting magnetism of the magnetized portions 107. The magnetized portions 107 of the magnetic medium 103 are magnetized by a vertical magnetization system as shown in FIG. 18.

Figure 13:
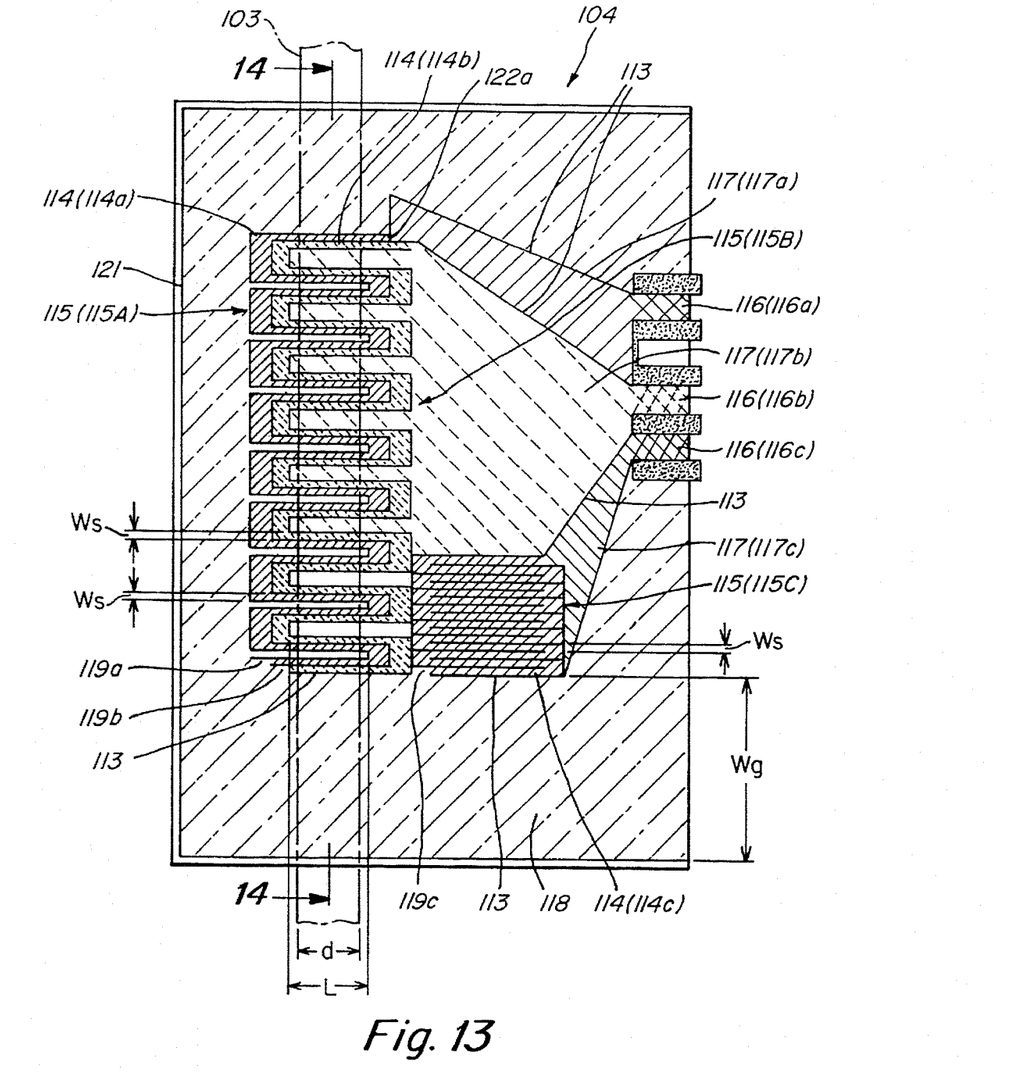
FIG. 13 is a plane view of a detecting portion.
Figure 14:
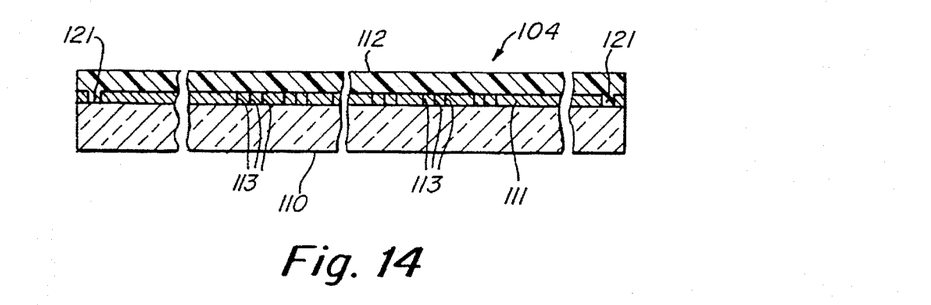
FIG. 14 is a sectional view cut along with 14—14 shown in FIG. 13.

As shown in FIG. 14, the detecting portion 104 is obtained by forming a thin film layer 111 comprising a material having magnetic resistance effect, for example, Permalloy so as to have a thickness of about 1 μm on a glass substrate 110 and covering this thin film layer 111 with a protective layer 112 of a synthetic resin, etc., for example, polyether amide. On the thin film layer 111, three elements 115 (115A, 115B and 115C) having zigzag current passages 114 (114a, 114b and 114c) as shown in FIG. 13 are formed by carving fine insulating lines 113 by laser processing, and also lead paths 117 (117a, 117b, and 117c) to be connected with terminals portions 116 (116a, 116b and 116c) corresponding to the current passages 114a, 114b and 114c of the respective elements 115A, 115B and 115C are formed, and further a ground 118 having a sufficient area is formed therearound.

One of the reasons why such a ground 118 having a wide area formed around the respective elements 115 is to cope with noise, and another reason is to secure current volume which is a problem inherent in a constant current structure described below. That is, by providing the ground 118 forming a wide area of the same potential region, induced current due to external noise can be eliminated without giving influence on the elements 115, whereby noise resistance is improved. Therefore, terminal portions 119a, 119b and 119c of the respective elements 115A, 115B and 115C are directly opened to the ground 118. Further, in the case of a constant current structure, a relatively large volume of current is always flown constantly so that a ground is easily corroded. However, by using the ground 118 having a wide area, this problem can be prevented effectively. In such a ground 118, it is preferred that a total of three Ws which are widths Ws at the minimum width portions of the respective current passages 114a, 114b and 114c of the three elements 115A, 115B and 115C, and a width Wg at its main current passage portion satisfy a relation of $Wg \geq (3Ws)^2$. As shown in FIG. 15, also on the lead portion 105, current passages 125 (125a, 125b and 125c) corresponding to the current passages 114 (114a, 114b and 114c) of the detecting portion 104, respectively, are provided, and a ground 126 corresponding to the ground 118 is also provided. In this lead portion 105, also a width Wg at a main current passage portion of the ground 126 has the same size as that of the detecting portion 104.

Further, as shown in FIG. 13 and FIG. 14, a continuous narrow removing groove 121 is formed around three sides of the ground 118, and the protective layer 112 is fixed in this removing groove 121. This is to prevent penetration of water into the thin film layer 111 with more certainty. That is, if the edge face of the thin film layer 111 is exposed to the outside, water is penetrated through said edge face to corrode the thin film layer 111 and lower its insulating property. In order to prevent these problems, the edge face of the thin film layer 111 is required to be surely covered with the protective layer 112 or other suitable synthetic resin. However, it is unexpectedly difficult to mount a synthetic resin on an extremely narrow edge face precisely, and sufficient coating cannot be necessarily obtained. However, by using a means of fixing the protective layer 112 in the removing groove 121 as described above, sufficient covering can be obtained easily, and penetration of water into the thin film layer 11 can be prevented with more certainty.

Further, the element 115A is formed of the outer current passage 114a facing to the ground 118 and the inner current passage 114b. At a connecting portion of a lead path connecting end 122a which is a beginning portion of a lead path 117 corresponding to the outer current passage 114a and a lead path 117a, the insulating line 113 has a pattern of expanding outside at a right angle. This is because when the insulating line 113 at a portion where a zigzag pattern of the element 115A is formed is extended as such to form a lead path, resistance of the element 115A becomes larger than resistances of the other elements 115B and 115C. Said pattern is to prevent this problem and make resistance values of the respective elements 115A, 115B and 15C uniform.

Figure 12:
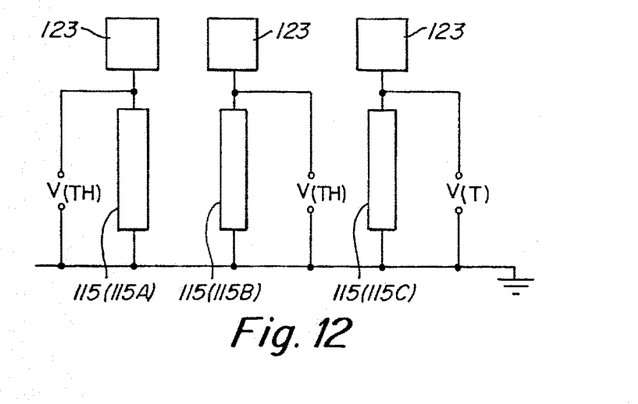
FIG. 12 is a circuit diagram of a magnetic resistance effective type magnetic sensor according to Example C of the present invention.

As shown in FIG. 12, one ends of the three elements 115A, 115B and 115C are connected with constant current circuits 123, 123 and 123, respectively, and the other ends are connected with the ground 118 in common so that a constant current i is always flown, and changes of voltages at the respective both ends are output as magnetic detection information.

As described above, by flowing the constant current i from the constant current circuits 123 and detecting magnetism by changes of voltages at the both ends of the elements, decrease of effectiveness of magnetic resistance caused by temperature elevation can be compensated and useful output can be obtained even under higher temperature atmosphere than temperature atmosphere under which a conventional one can be utilized effectively. This point is described in detail below.

As described above, it has been found that effectiveness of magnetic resistance S of the element is decreased by temperature elevation, and on the other hand, intrinsic resistance of the element, i.e. resistance RT of the element under a state that it is not influenced by a magnetic field under atmosphere at a certain temperature T is increased by temperature elevation. When data regarding decrease rate Ks of this effectiveness of magnetic resistance S and increase rate KT of the intrinsic resistance RT were collected, it was found that Ks was −0.223 %/° C. and KT was 0.221%/° C. This finding led to compensation of decrease of the effectiveness of magnetic resistance caused by temperature by the constitution described above.

That is, resistance R(TH) of the element influenced by a certain magnetic field H under atmosphere at a certain temperature T is $$R(TH)=R_0+\Delta RT+\Delta RH=RT+\Delta RH$$

($R_0$; standard resistance of element, i.e. resistance of element under atmosphere at standard temperature and magnetic field of 0, $\Delta RT$; increased amount of resistance of element caused by temperature elevation, $\Delta RH$; increased amount of resistance of element caused by magnetic resistance effect, and RT; intrinsic resistance of element under atmosphere at certain temperature T).

Therefore, voltage V(TH) applied to both ends of the element is $$V(TH)=R(TH)\cdot i=(RT+\Delta RH)\cdot i,$$

and magnetism-sensing output $\Delta V(TH)$ is $$\Delta V(TH)=\Delta RH\cdot i.$$

Here, $\Delta RH$ which is a base of the magnetism-sensing output $\Delta V$ (TH) is $$\begin{aligned}\Delta RH &= S\cdot RT \\ &= S_0(1+Ks\cdot T)\cdot R_0(1+KT\cdot T) \\ &= S_0\cdot R_0(1+Ks\cdot T)(1+KT\cdot T) \\ &= S_0\cdot R_0(1+Ks\cdot T+KT\cdot T+Ks\cdot KT\cdot T^2)\end{aligned}$$

($S_0$; effectiveness of magnetic resistance of element under atmosphere at standard temperature), and $Ks\cdot KT\cdot T^2$ is a square and can be ignored. As a result, $$\Delta RH=S_0\cdot R_0(1+(Ks+KT)T),$$

and Ks is $Ks=-KT$ as described above. As a result, $$\Delta RH=S_0\cdot R_0,$$

which means that $\Delta RH$ does not depend on temperature. Therefore, the magnetism-sensing output $\Delta V(TH)$ is not also influenced by temperature.

This point can be further clarified by comparison with output in Japanese Patent Publication No. 5067/1982 described above.

That is, in Japanese Patent Publication No. 5067/1982, output $\Delta V$ obtained is $$\Delta V=-\frac{\Delta\rho}{4\rho_0}\cdot\cos 2\theta\cdot V_0$$

Here, "$\Delta\rho$" in this formula corresponds to the above $\Delta RH$ in the present invention. "$\Delta\rho$" is not influenced by temperature by the same reason as described above, but resistance when an element is not influenced by a magnetic field, i.e. intrinsic resistance $\rho_0$ is increased at a temperature T $$\rho_0(T)=\rho_0(1+KT\cdot T)$$

As a result, the output $\Delta V$ becomes small, whereby effect of compensating decrease caused by temperature as in the present invention cannot be obtained.

Among the three elements 115A, 115B and 115C, two elements 115A and 115B are used for detecting magnetism. These two elements 115A and 115B are so designed that their zigzag patterns are complicated alternately and they are so jointed that the patterns are get out of position by half pitch relative to the magnetized patterns of the magnetic medium 103 described above. This is a technique frequently used for an encoder, which is to recognize a moving direction of the detecting head 102 based on which element outputs previously. Thus, the two elements 115A and 115B output separately as shown in FIG. 12.

Here, length L of the respective elements 115A and 115B is made 1 to 1.5 times based on a diameter d of the magnetic medium 103. This is a value obtained experientially regarding the log-shaped magnetic medium 103 as a range which maximizes magnetism-sensibility of the respective elements 115A and 115B. That is, in general, the magnetism-sensibility of the element 115 becomes maximum when its length L has a specific relation to a width of a magnetic field of the magnetized portion 107 of the magnetic medium 103. This relation can be determined easily by calculation when a magnetic medium has a square rod shape and its magnetized portions are arranged in a straight line. However, in the case of the log-shaped magnetic medium 103, it cannot be obtained by easy calculation. As a result of preparing elements with various lengths and repeating experiments, it could be found that magnetism-sensibility is maximized in the relation as described above.

The remaining element 115C is used for compensating decrease caused by temperature in order to easily obtain output of digital wave shape required when it is used for an encoder, and it is designed to have the same intrinsic resistance as those of the elements 115A and 115B and provided as close as possible to the two elements 115A and 115B so that it is under the same temperature atmosphere as those of the elements 115A and 115B as much as possible. The above compensation of decrease caused by temperature conducted by this element 115C is to remove the temperature factor $\Delta RT$ in the above intrinsic resistances ($RT=R_0+\Delta RT$) of the elements 115A and 115B for detecting magnetism without complicated calculation process, etc. by determining difference between outputs of the element 115A and 115B for detecting magnetism and output of this element 115C.

That is, difference between output V(TH) of the element 115A (115B) and output V(T) of the element 115C is determined as $$\begin{aligned} V(TH) - V(T) &= (R_0 + \Delta RT + \Delta RH) \cdot i - (R_0 + \Delta RT) \cdot i \\ &= i(R_0 + \Delta RT + \Delta RH - R_0 - \Delta RT) \\ &= i \cdot \Delta RH, \end{aligned}$$

and $\Delta RT$ is removed from output, i.e. compensated to obtain only $\Delta RH$ which is a component in which resistance is changed by magnetism. This facilitates processing of converting analog wave shape obtained by the element into digital wave shape. That is, while a value of $\Delta RH$ is, for example, about 2% based on $R_0$, $\Delta RT$ is also about 2% based on $R_0$ depending on the case, and as a result, a standard value when analog wave shape is converted into digital wave shape is fluctuated greatly. However, this problem can be prevented by previously compensating $\Delta RT$ as described above.

Figure 5:
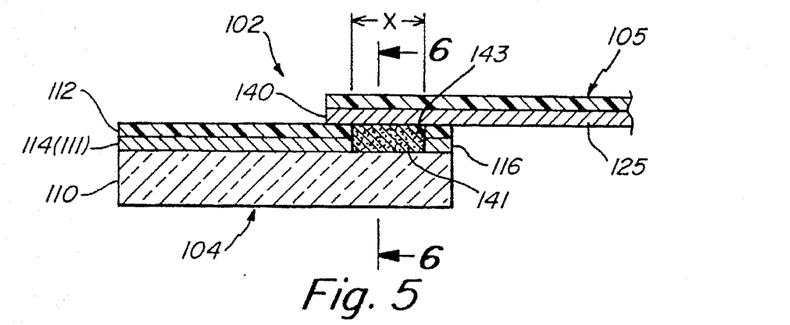
FIG. 5 is a sectional view of a connected portion of a detecting portion and a lead portion of a magnetic resistance effective type magnetic sensor prepared by a preparation method according to Example C of the present invention.
Figure 6:
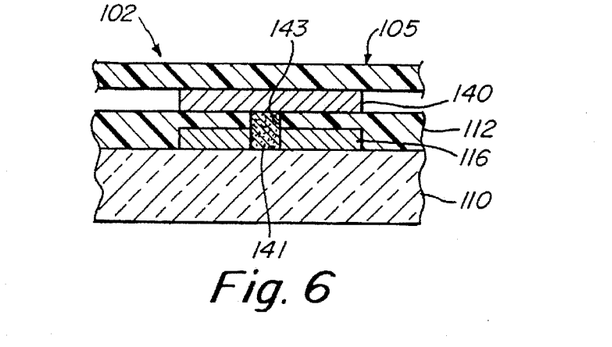
FIG. 6 is a sectional view cut along with an 6—6 line shown in FIG. 5.

Next, the method for preparing the magnetic resistance effective type magnetic sensor 102 described above is explained. FIG. 5 and FIG. 6 each show a connected portion of the detecting portion 104, and the lead portion 105 of the magnetic resistance effective type magnetic sensor (detecting head) 102 prepared according to the preparation method of the present invention. The steps of preparing this magnetic resistance effective type magnetic sensor 102 are shown in FIG. 7 to FIG. 10, and described below in due order. In the figures, the insulating lines 113 and the removing groove 121 are omitted.

Figure 7:
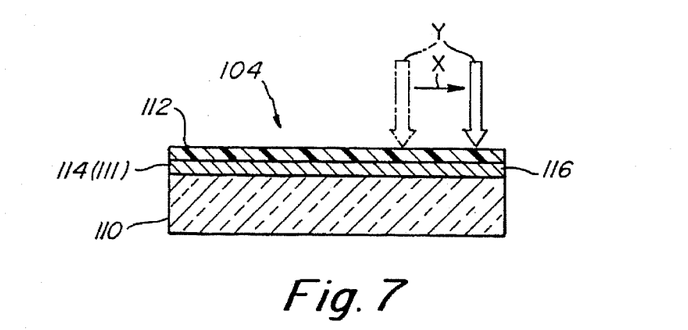
FIG. 7 is a sectional view of a substrate showing the first step.

First step (see FIG. 7)

At the detecting portion 104, the current passage (thin film layer) 114 is formed on the surface of the substrate 110, and the protective layer 112 is provided on the whole surface of this current passage 114 as described above.

Figure 8:
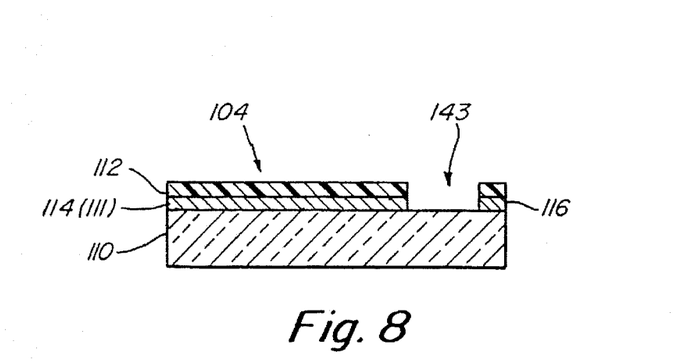
FIG. 8 is a sectional view of a substrate showing the second step.

Second step (see FIG. 7 and FIG. 8)

The terminal portion 116 of the current passage 114 is irradiated with laser beam Y from above and moved by a predetermined length X in a straight line. By doing so, on a portion corresponding to the terminal portion 116 of the current passage 114 at a detecting portion 104 side, a straight removed portion 143 with a narrow width and a predetermined length X is formed. At that time, it is preferred to remove only the protective layer 112, but since laser beam Y with high energy is employed, the terminal portion 116 is also removed inevitably. However, even if the terminal portion 116 is also removed as described above, there is no problem in electrical characteristics.

Figure 9:
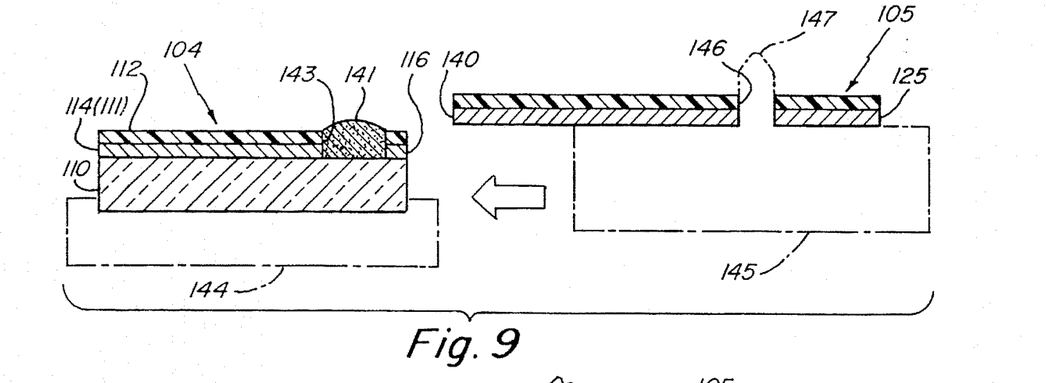
FIG. 9 is a sectional view of a substrate showing the third step.

Third step (see FIG. 9)

To the removed portion 143 formed by laser beam Y, solder 141 is applied. The solder 141 is used for connecting with the lead portion 105 and a sufficient amount thereof is applied to the removed portion 143. The detecting portion 104 to which this solder 141 is applied is fixed in one jig 144 of a pair of jigs 144 and 145 prepared for positioning. In this pair of jigs 144 and 145, relative to one jig 144 which is fixed, the other jig 145 moves precisely to conduct positioning, and the centers of the both are coincident and not out of place.

Next, described is a process of mounting a terminal portion 140 of the current passage 125 of the lead portion 105 precisely on the terminal portion 116 of the current passage 114 of the detecting portion 104. On the both left and right sides of the lead portion 105, a pair of holes 146 for positioning are provided, and by using these holes 146, the lead portion 105 can be mounted precisely on the detecting portion 104. That is, this other jig 145 has a pin 147 which stands vertically, and under a state that this pin 147 is inserted into the hole 146 of the lead portion 105, the lead portion 105 is fixed in the other jig 145. This other jig 145 on which the lead portion 105 is mounted is moved precisely relative to one jig 144, and on the terminal portions 116 (116a, 116b and 116c) of the current passages 114 at a detecting portion 104 side, the terminal portions 140 (140a, 140b and 140c) of the current passages 125 at a lead portion 105 side can be mounted in a precisely coincident state (see FIG. 15).

Figure 10:
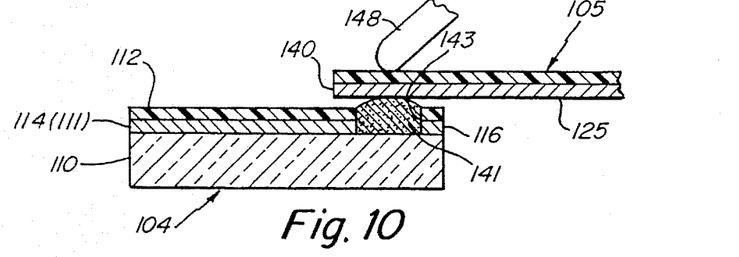
FIG. 10 is a sectional view of a substrate showing the fourth step.
Figure 11:
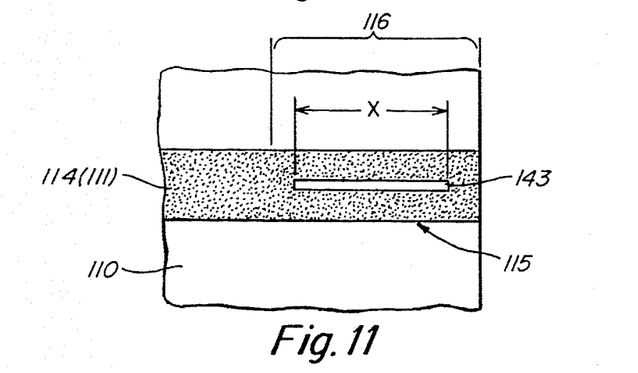
FIG. 11 is a plane view showing a shape of a removed portion.

Fourth step (see FIG. 10)

After the lead portion 105 is mounted precisely on the detecting portion 104, a soldering iron 148 is pushed against the lead portion 105 to heat the solder 141. By using the melted solder 141, the terminal portions 116 at a detecting portion 104 side and the terminal portions 140 at a lead portion 105 side are bonded. At that time, as to the terminal portions 116 at a detecting portion 104 side, only the end faces (portions corresponding to the thickness of the terminal portions 116) at the removed portion 143 are in contact with the solder 141, but there is no particular problem in conductive characteristics, and electrical characteristics of the magnetic resistance effective type magnetic sensor 102 are not lowered.

The connected portion of the magnetic resistance effective type magnetic sensor 102 prepared in the first step to the fourth step described above is shown in FIG. 5 and FIG. 6 described above. All terminal portions 116 (current passages 114) at a detecting portion 104 side are covered with the protective film 112 or the solder 141 so that water is not penetrated to reach the terminal portions 116. That is, both of the terminal portions 116 and the protective layer 112, and the terminal portions 116 and the solder 141 are adhered closely by strong bonding strength so that there is no fine gap to which water is penetrated. In the above description, laser beam Y was used for forming the removed portion 143, which is not limitative. The similar removed portion 143 may be formed by other mechanical means. For example, by using a narrow soldering iron, only the protective layer 112 may be removed by scratching. Further, as a heating means for melting the solder 141, it is not limited to the soldering iron 148, and any means may be employed so long as it can surely melt the solder 141.

The method for preparing the magnetic resistance effective type magnetic sensor according to the present Example C is as described above. Among a pair of jigs, a jig in which a lead portion is fixed is equipped with a pin, and a hole for positioning into which the pin of the jig is to be inserted is formed on the lead position so that the lead position and said jig are moved integrally. Thus, this lead position can be positioned precisely relative to a detecting position.

EXAMPLE D

The present Example is concerned with a method for preparing a magnetic resistance effective type magnetic sensor, particularly to a method for preparing a magnetic resistance effective type magnetic sensor suitably used for a magnetic type encoder.

Figure 20:
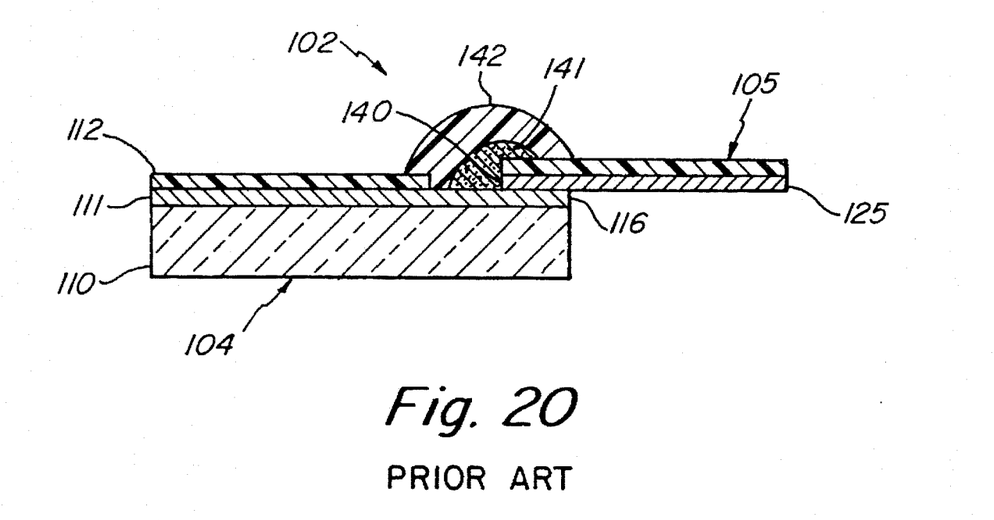
FIG. 20 is a sectional view corresponding to FIG. 5, which shows a conventional example.

As a conventional magnetic resistance effective type magnetic sensor, there have been, for example, those disclosed in Japanese Patent Publication No. 41335/1979, Japanese Patent Publication No. 5067/1982, etc. and shown in FIG. 20. 102 shows a detecting head as a magnetic resistance effective type magnetic sensor and composed of the detecting portion 104 and the lead portion 105. The detecting portion 104 is formed of the glass substrate 110, the thin film layer 111 (which becomes several current passages by insulating lines not shown in the figure) comprising a material having magnetic resistance effect, for example, Permalloy, and the protective layer 112 of a synthetic resin, etc. such as polyether amide which covers a portion other than the terminal portion 116 of said thin film layer (current passage) 111. That is, the protective layer 112 is provided under a state that the terminal portion 116 and the vicinity thereof are masked previously, and only the terminal portion 116 and the surface of the substrate 110 around the terminal portion 116 are exposed. On this terminal portion 116, the terminal portion 140 of the current passage 125 of the lead portion 105 is mounted and connected by applying the solder 141 from above. Finally, this solder 141 is covered with a coating layer 142 comprising an epoxy resin to prevent oxidation and change in quality of the connected part.

However, in such a prior art, fine gaps are easily formed between the coating layer (epoxy resin) 142 and the protective layer (polyether amide) 112 so that water generated by dew condensation, etc. may be penetrated through these gaps to partially rust the thin film layer (current passage) 111 of the detecting portion 104. Such fine gaps are formed due to difference of thermal expansion rate between the coating layer (epoxy resin) 142 and the protective layer (polyether amide) 112, and will give bad influence on properties of the detecting head 102. That is, a magnetic resistance effective element detects magnetism by minute change of resistance so that it tends to be damaged even by a minute amount of water.

The present Example D has been made by paying attention to such a prior art, and is to provide a method for preparing a magnetic resistance effective type magnetic sensor having excellent water resistance.

In order to accomplish the above object, the method for preparing the magnetic resistance effective type magnetic sensor according to the present Example is a method for preparing a magnetic resistance effective type magnetic sensor which comprises a detecting portion in which a thin film layer having magnetic resistance effect is formed on a substrate, zigzag insulating lines are carved on said thin film layer to provide current passages for forming elements, and further said thin film layer is covered with a protective layer made of a synthetic resin, and a lead portion having current passages to be connected with the current passages of said detecting portion, characterized in that the whole thin film layer of the detecting portion described above is covered with the protective layer, a portion corresponding to a terminal portion of said protective layer is removed partially, solder is applied to a removed portion of said protective layer, terminal portions of the current passages at a lead portion side put on said solder are heated to connect the terminal portions of the detecting portion and the lead portion.

Figure 19:
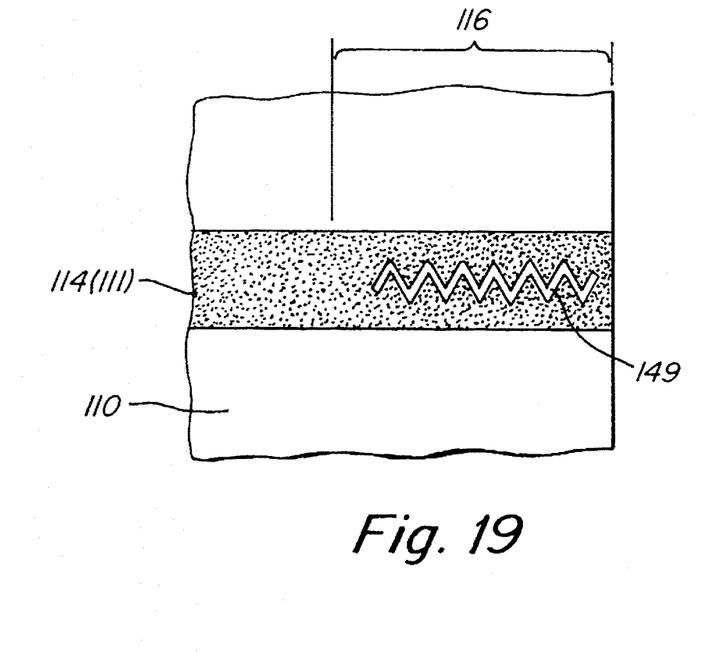
FIG. 19 is a plane view showing a shape of a removed portion according to Example D.

FIG. 19 is a view showing Example D. In the present Example, a removed portion 149 by laser beam is shaped in zigzag wave. As compared with the case where the removed portion is straight as in Example C, an area where the solder is in contact with the terminal portion 149 is increased, which is advantageous in the point of conductivity. Further, in addition of straight line shape and wave shape, a removed position shaped in parallel plural lines in which plural lines are provided in parallel may be formed, or a porous removed portion where a large number of dots are provided. Since the other constitutions, actions and effects are the same as those of the previous Example, repeated description is omitted.

The method for preparing the magnetic resistance effective type sensor according to the present Example D is as described above. The whole thin film layer of the detecting portion is covered with the protective layer, a portion corresponding to the terminal portion of said protective layer is removed partially, solder is applied to the removed portion of said protective layer, the terminal portions of the current passages at a lead portion side put on said solder are heated to connect the terminal portions of the detecting portion and the lead portion. Thus, the terminal portions of the current passages are surely covered with the solder and the protective layer so that water generated by dew condensation, etc. is not penetrated to reach the current passages. Therefore, generation of rust of the current passage which gives bad influence on properties of the magnetic resistance effective type magnetic sensor can be prevented.

UTILIZABILITY IN INDUSTRY

As clearly seen from the above description, in the magnetic resistance element of the present invention, moisture resistance is excellent, detection output is large and cracks are hardly formed by thermal stress.

Further, the magnetic sensor of the present invention has high durability and reliability.

Further, the method for preparing a magnetic sensor of the present invention provides a magnetic sensor in which a lead position and a detecting portion are positioned precisely.

Furthermore, the method for preparing a magnetic sensor of the present invention provides a magnetic sensor in which terminal portions have high water resistance.

Thus, the present invention provides a magnetic encoder in which problems of the prior art are cancelled, and can extremely contribute to development of industry.

We claim:

1. A magnetic resistance effective type element sensor, including; a head of a magnetic resistance effective type element sensor including a substrate, a ferromagnetic thin film formed on said substrate and a synthetic resin thin film formed on said ferromagnetic thin film; a cylindrical magnetic recording medium magnetized along its axis; a magnetic resistance effective type mounting arranged so as to face said synthetic resin thin film of said element sensor bridging in a cross sectional direction of said cylindrical magnetic recording medium.

2. The magnetic resistance effective type element sensor according to claim 1, wherein the substrate is glass or ceramics.

3. The magnetic resistance effective type element sensor according to claim 1, wherein the ferromagnetic thin film is Permalloy.

4. The magnetic resistance effective type element sensor according to claim 1, wherein the synthetic resin thin film fitted between the head of the magnetic resistance effective type element sensor and the magnetic resistance effective type mounting is a polyimide resin or a polyamide resin.

5. The magnetic resistance effective type element sensor according to claim 2, wherein the ferromagnetic thin film is a ferromagnetic nickel-iron alloy.

6. The magnetic resistance effective type element sensor according to claim 2, wherein the synthetic resin thin film fitted between the head of the magnetic resistance effective type element sensor and the magnetic resistance effective type mounting is a polyimide resin or a polyamide resin.

7. The magnetic resistance effective type element sensor according to claim 3, wherein the synthetic resin thin film fitted between the head of the magnetic resistance effective type element sensor and the magnetic resistance effective type mounting is a polyimide resin or a polyamide resin.

8. The magnetic resistance effective type element sensor according to claim 5, wherein the synthetic resin thin film fitted between the head of the magnetic resistance effective type element sensor and the magnetic resistance effective type mounting is a polyimide resin or a polyamide resin.

* * * * *